United States Patent
Chung

(10) Patent No.: US 6,869,636 B2
(45) Date of Patent: Mar. 22, 2005

(54) METHOD OF EVAPORATING FILM USED IN AN ORGANIC ELECTRO-LUMINESCENT DISPLAY

(75) Inventor: Chia-Tin Chung, Miaoli (TW)

(73) Assignees: Chi Mei Optoelectronics Corporation, Tainan (TW); Kyocera Corporation, Kyoto (JP)

( * ) Notice: Subject to any disclaimer, the term of this patent is extended or adjusted under 35 U.S.C. 154(b) by 334 days.

(21) Appl. No.: 10/055,646

(22) Filed: Jan. 22, 2002

(65) Prior Publication Data

US 2003/0072876 A1 Apr. 17, 2003

(30) Foreign Application Priority Data

Oct. 16, 2001 (TW) ........................................ 90125566 A

(51) Int. Cl.⁷ .................... C23C 14/04; C23C 14/12; B05D 5/06; B05D 5/12
(52) U.S. Cl. .................. 427/66; 427/68; 427/69; 427/70; 427/255.14; 427/255.15; 427/255.23; 427/255.6; 118/720; 118/721; 118/726
(58) Field of Search ............... 427/66, 68, 69, 427/70, 248.1, 255.14, 255.15, 255.23, 255.6, 255.7; 118/720, 721, 726

(56) References Cited

U.S. PATENT DOCUMENTS

| | | | |
|---|---|---|---|
| 5,104,695 A | * | 4/1992 | Greer et al. ................ 427/250 |
| 5,395,740 A | * | 3/1995 | Swirbel et al. ............. 430/315 |
| 5,688,551 A | * | 11/1997 | Littman et al. ............... 427/64 |
| 5,904,961 A | * | 5/1999 | Tang et al. ................. 427/561 |
| 2001/0006827 A1 | | 7/2001 | Yamazaki et al. |

* cited by examiner

*Primary Examiner*—Michael Cleveland
(74) *Attorney, Agent, or Firm*—Merchant & Gould P.C.

(57) ABSTRACT

In evaporating thin film used in organic electro-luminescent (EL) display, a mask having a plurality of openings is placed below a display substrate, and a plane evaporation source is placed below the mask. The plane evaporation source has a plurality of evaporating material cells which are respectively aligned to the openings of the mask. Next, evaporating the evaporating material cells, a plurality of thin films is deposited on predetermined regions of the display substrate.

14 Claims, 8 Drawing Sheets

METHOD OF EVAPORATING FILM USED IN AN ORGANIC ELECTRO-LUMINESCENT DISPLAY

BACKGROUND OF THE INVENTION

1. Field of the Invention

The present invention relates to a method of evaporating thin film and, more particularly, to a method of evaporating thin film used in an organic electro-luminescent (EL) display.

2. Description of the Related Art

In new generation panel display technologies, organic electro-luminescent (EL) display using organic compounds as luminescent materials is a laminated-film type display and has advantages of self luminescence, thin profile, light weight, and low driving voltage. In general, on a glass substrate of the OLED, a lamination body comprises an anode layer, a hole-injecting layer, a hole-transporting layer, an organic luminescent film, an electron-injecting layer, an electron-transporting layer, and a cathode layer. After applying an outer voltage to the OLED, both the electrons generated from the cathode layer and the holes generated from the anode layer move to reach the organic luminescent film, and then bombard the film and combine to transform electricity into luminosity.

In fabricating the lamination body, conventional photolithography is not suited for patterning because the EL elements are weak with respect to water and oxygen. Thus evaporation with a shadow mask is used to deposit and pattern thin film on the glass substrate at the same time. As shown in FIG. 1, a metal mask 12 with a plurality of openings 11 is placed below a glass substrate 10, and an evaporation source 14 is placed below the metal mask 12. During evaporation, the materials in the evaporation source 14 can pass through the openings 11 to be deposited on the predetermined regions of the glass substrate 10. However, the evaporation source 14 is a single/point source that causes a shadow effect. Also, the materials piling in the evaporation source 14 are not compact enough to reduce the thermal conductivity, thus a uniform temperature is not easily achieved in the evaporation source 14, resulting in poor uniformity of deposition thickness. One solution is to reduce the distance between the evaporation source 14 and the glass substrate 10, and the other is to rotate the glass substrate 10 during evaporation. Both methods may, however, decrease evaporation efficiency.

U.S. Published Application No. 2001/0006827 discloses a method of using linear evaporation source to form the lamination body. As shown in FIGS. 2A and 2B, a shadow mask 18 with a plurality of openings 17 is placed below a glass substrate 16, and a linear evaporation source 20 with a plurality of evaporation cells 22 arranged in a line is placed along X direction below the shadow mask 18. During evaporation, the linear evaporation source 20 is moved along Y direction, and the materials in each of the evaporation cell 22 can pass through the openings 17 to be deposited on predetermined regions of the glass substrate 16. However, this generates high costs and a complex process for controlling increased parameters. Also, this only improves the deposited-thickness uniformity in direction Y, but not direction X. In addition, this still cannot solve the above-mentioned problems of difficulty in achieving an uniform temperature during evaporation, and low efficiency in evaporation source material use.

SUMMARY OF THE INVENTION

The present invention provides a method of evaporating thin film used in OLED to solve the above-mentioned problems.

In evaporating thin film, a mask having a plurality of openings is placed below a display substrate, and a plane evaporation source is placed below the mask. The plane evaporation source has a plurality of evaporating material cells respectively aligned to the openings of the mask. Next, the evaporation of the evaporating material cells deposits a plurality of thin films on predetermined regions of the display substrate.

Accordingly, it is a principle object of the invention to strictly control the evaporation rate and increase the evaporation rate.

It is another object of the invention to increase evaporation source material use.

Yet another object of the invention is to avoid shadow effect.

It is a further object of the invention to obtain thin film with good uniformity in thickness and distribution.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

The present invention provides a method of evaporating thin film used in organic EL display, in which a first mask with a rough pattern and a point evaporation source are employed to form a plane evaporation source, and then a second mask with a precise pattern and the planar evaporation source are employed to deposit a thin film on predetermined regions of a glass substrate. Using the evaporating method to form a lamination body used in the organic EL display, especially for forming the organic luminescent layer, improves uniformity of thickness for the deposited-film and temperature uniformity during evaporation, and increases both deposition rate and evaporating material use efficiency, while also avoiding shadow effect.

First Embodiment

Figure 1:
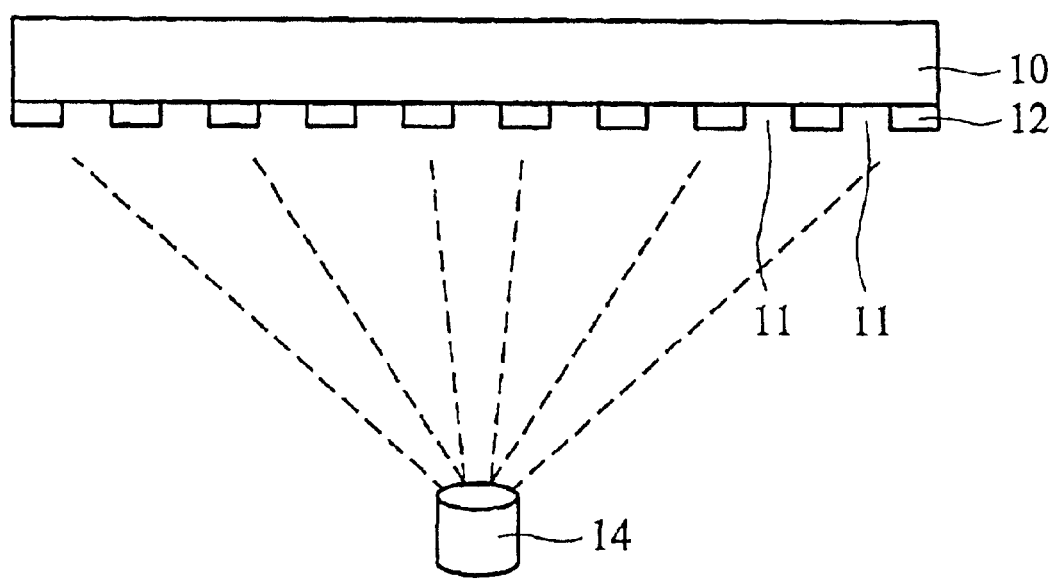
FIG. 1 is a schematic diagram showing a method of using single/point evaporation source according to the prior art.
Figure 2A:
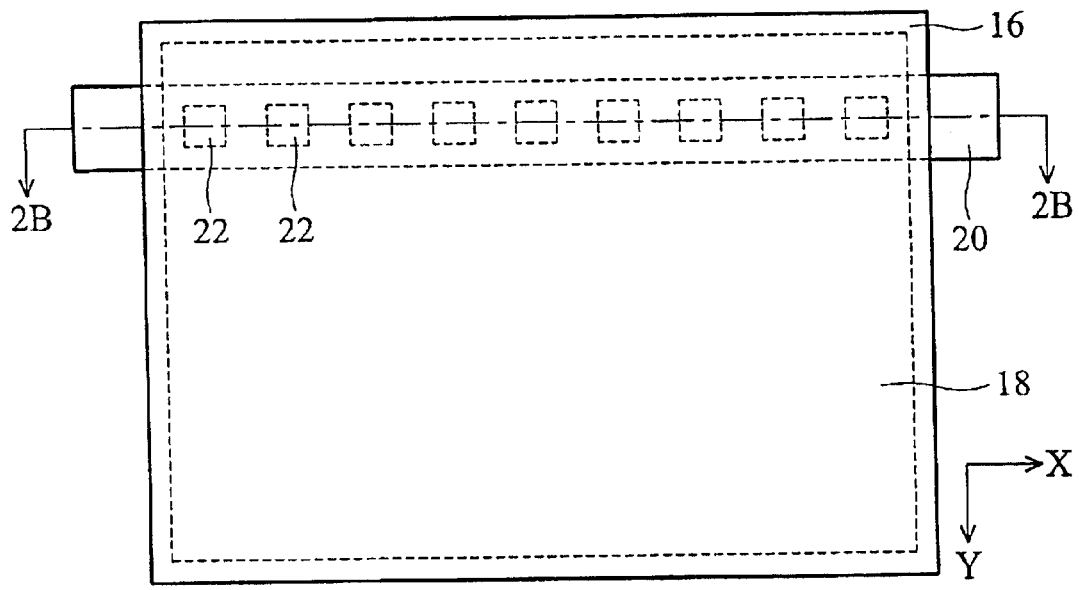
FIGS. 2A and 2B are schematic diagrams showing a method of using linear evaporation source according to the prior art.
Figure 2B:
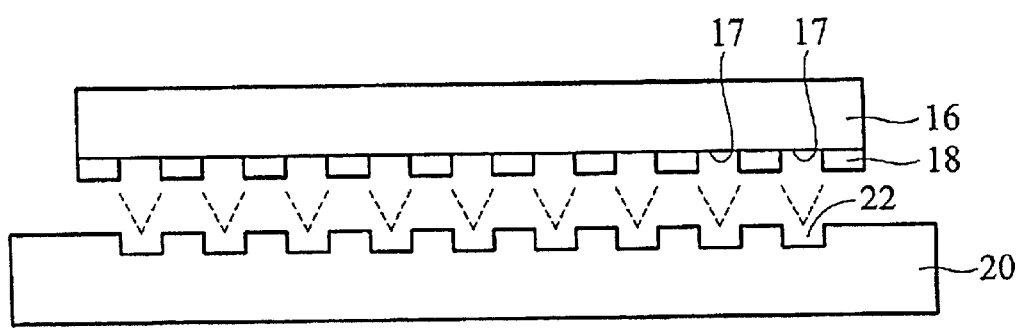
Figure 3A:
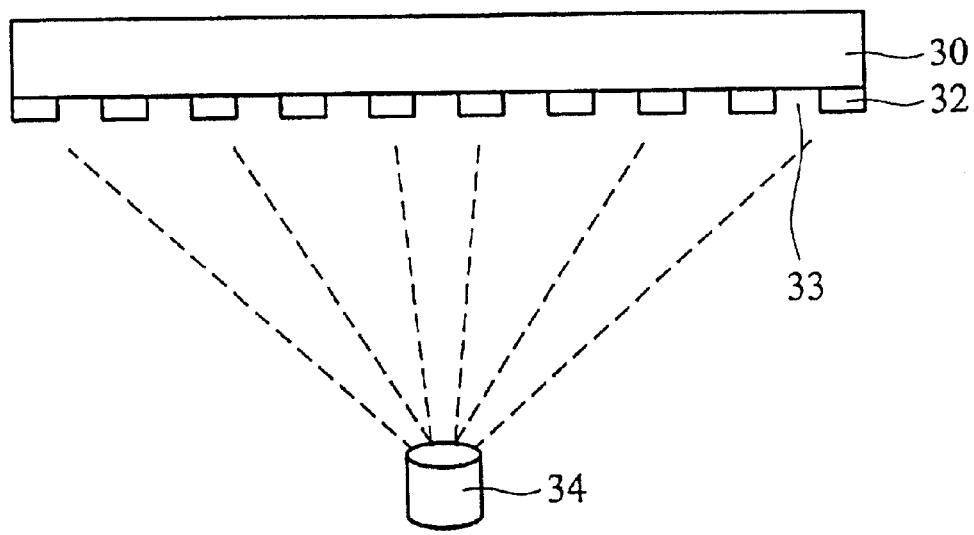
FIGS. 3A to 3C are schematic diagrams showing a method of evaporating thin film according to the first embodiment of the present invention.
Figure 3B:
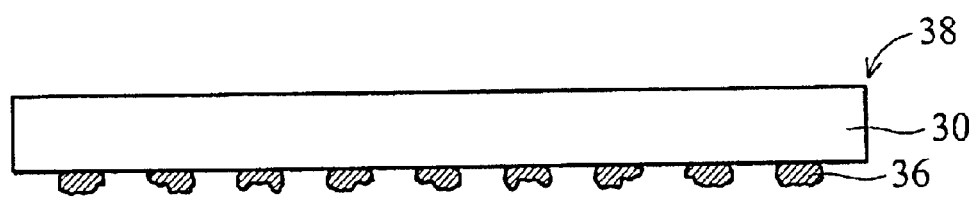
Figure 3C:
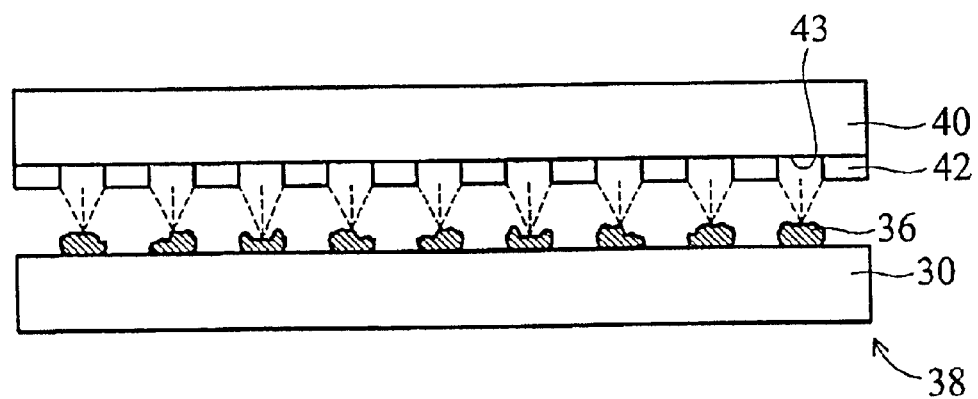

FIGS. 3A to 3C are schematic diagrams showing a method of evaporating thin film according to the first embodiment of the present invention. First, as shown in FIG. 3A, a first mask 32 with a rough pattern is placed below a metal plate 30, and a point evaporation source 34 is placed below the first mask 32. During the evaporation, the evaporating materials in the point evaporation source 34 can pass through a plurality of openings 33 patterned on the first mask 32, thus a plurality of first thin film 36 arranged in array are deposited on predetermined regions of the metal plate 30. As shown in FIG. 3B, the metal plate 30 with the first thin film 36 is employed as a plane evaporation source 38, and the first thin film 36 arranged in array are used as evaporating material cells 36. Preferably, the metal plate 30 is of high thermal-conductivity metallic material, such as Ta. The first mask 32 may be ceramic or metallic. In addition, during the evaporation, the metal plate 30 can be rotated to improve the evaporation property of the first thin film 36. Moreover, when the size of the metal plate 30 is unusually large, two or more point evaporation sources 34 can be used simultaneously to save evaporation time.

Next, as shown in FIG. 3C, a second mask 42 with a precise pattern is placed below a glass substrate 40, and the plane evaporation source 38 is inverted and placed below the second mask 42 where the evaporating material cells 36 are respectively aligned to a plurality of openings 43 of the second mask 42. In evaporating, the evaporating material cells 36 can pass through the opening 43 to deposit thin film on predetermined regions of the glass substrate 40, thus a patterned thin film layer is formed. By using the plane evaporation source 38, the distance between the glass substrate 40 and the evaporating material cell 36 can be reduced as much as possible. Therefore, without rotating the glass substrate 40, the evaporation rate is well controlled and increased, the evaporating materials are used more efficiently, and shadow effect is avoided. This also improves the uniformity in heating temperature of each evaporating material cell 36 on the plane evaporation source 38, thereby the thin film deposited on the glass substrate 40 has good uniformity of thickness and distribution. Furthermore, since the evaporating material cells 36 are self-aligned to the openings 43 of the second mask 42, only a small amount of evaporating material adheres to the second mask 42 during evaporation and thus, the necessity of cleaning the second mask 42 is reduced. This prolongs the lifetime of the second mask 42. Moreover, the first mask 32 can be omitted during the formation of the plane evaporation source 38, thus the first thin film 36 are more roughly formed on the metal plate 36 and the subsequent step of aligning the thin film 36 to the precisely-patterned openings 43 of the second mask 42 can be omitted.

Second Embodiment

Figure 4A:
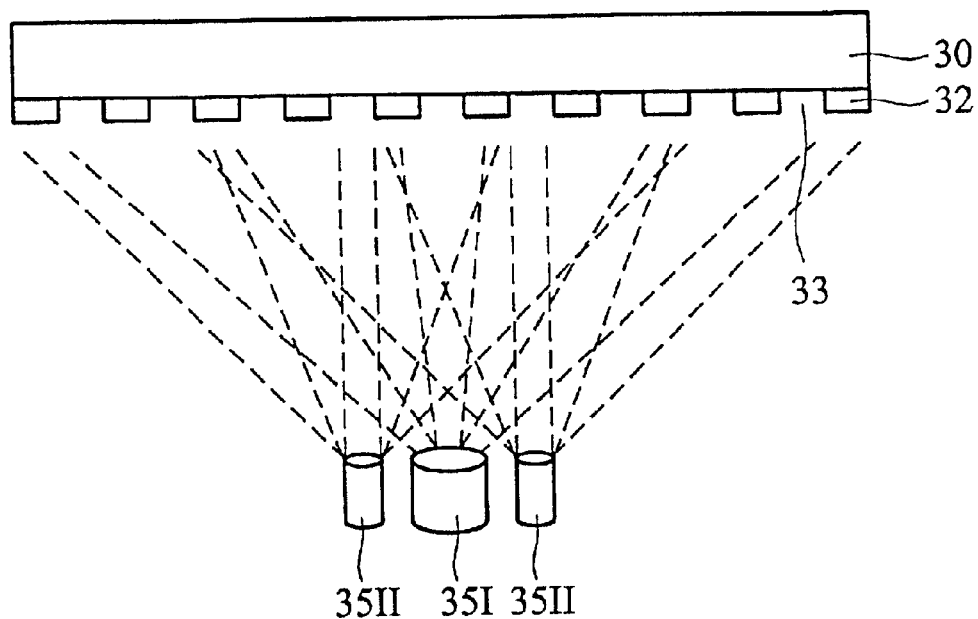
FIGS. 4A to 4C are schematic diagrams showing a method of evaporating thin film according to the second embodiment of the present invention.
Figure 4B:
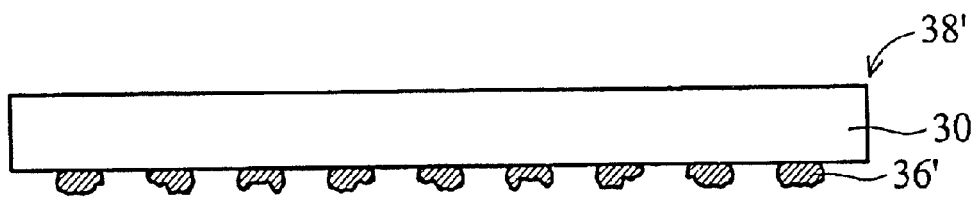
Figure 4C:
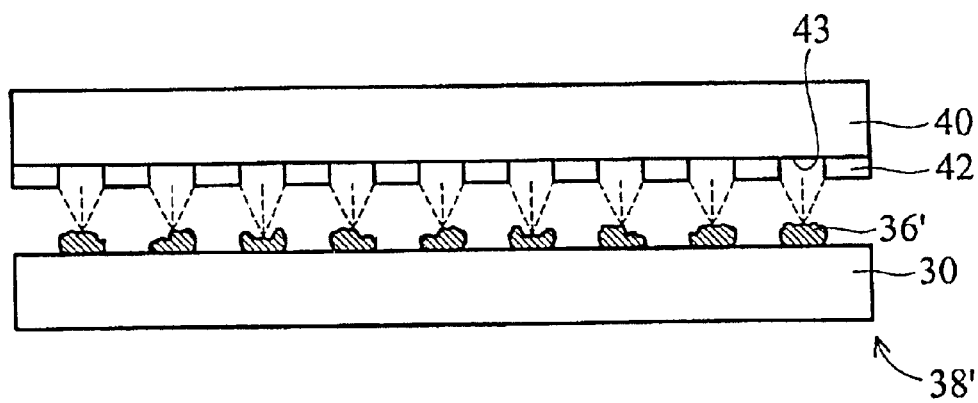

The second embodiment provides an evaporating method of improving the formation of the plane evaporation source to form a luminescent thin film used in the organic EL display. Generally, in evaporating luminescent thin film, evaporation materials comprise a host material and a dopant material. FIGS. 4A to 4C are schematic diagrams showing a method of evaporating thin film according to the second embodiment of the present invention. As shown in FIG. 4A, the first mask with a rough pattern is placed below the metal plate 30, and a host material evaporation source 35I and at least a dopant material evaporation source 35II are placed below the first mask 32. It is noticed that the host material evaporation source 35I and the dopant material evaporation source 35II must have the same evaporating temperature. In evaporating, the host material evaporation source 35I and the dopant material evaporation source 35II can pass through the openings 33 to deposit a plurality of first thin film 36' arranged in array on the metal plate 30. As shown in FIG. 4B, the metal plate 30 with the first thin films 36' serves as a plane evaporation source 38', and the thin film 36' serve as evaporating material cells 36'. The follow-up steps are the same as the above-described method in the first embodiment, as shown in FIG. 4C, the second mask 42 with a precise pattern and the plane evaporation source 38' are employed to deposit the luminescent thin film on predetermined regions of the glass substrate 40.

Third Embodiment

Figure 5A:
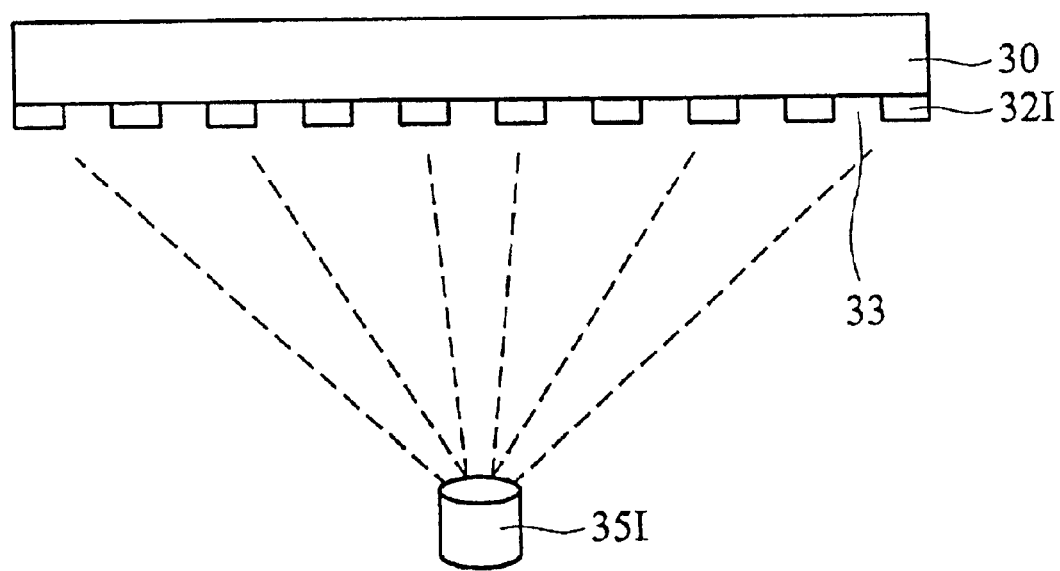
FIGS. 5A to 5E are schematic diagrams showing a method of evaporating thin film according to the third embodiment of the present invention.
Figure 5B:
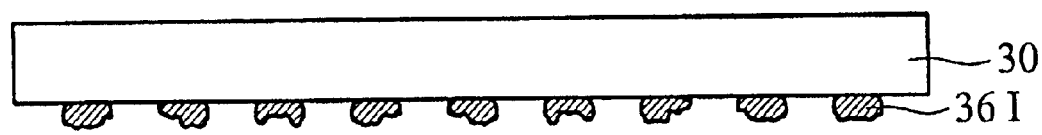
Figure 5C:
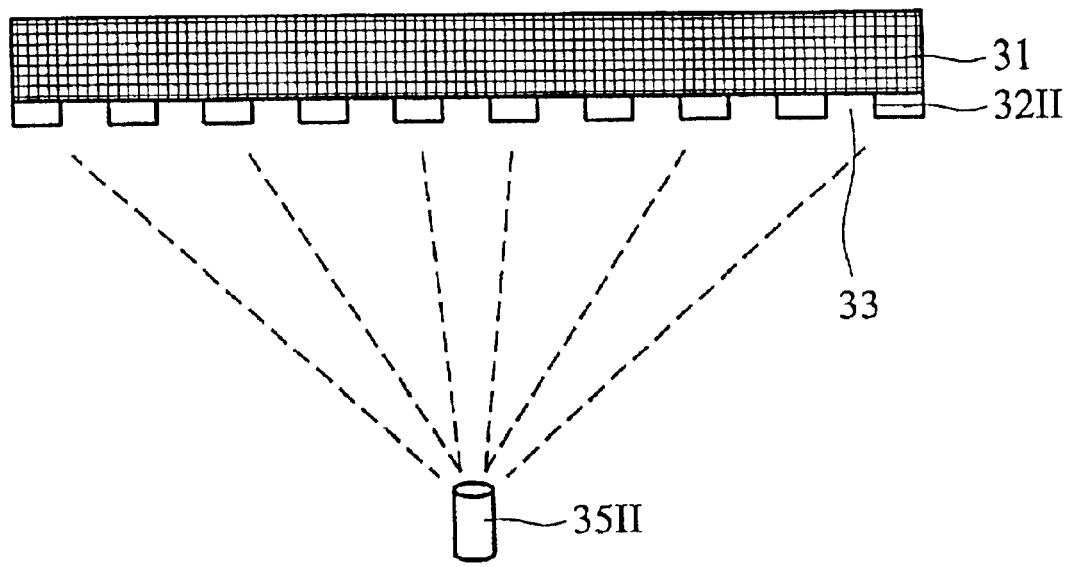
Figure 5D:
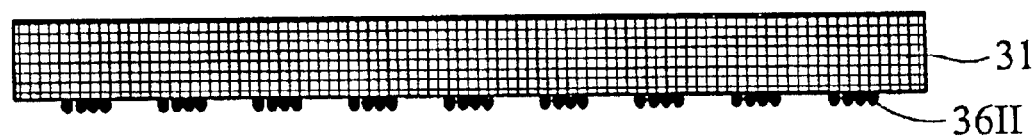

The third embodiment provides a co-evaporating method to form a luminescent thin film used in the organic EL display, especially when the host material evaporation source and the dopant material evaporation source have different evaporating temperatures. FIGS. 5A to 5E are schematic diagrams showing a method of evaporating thin film according to the third embodiment of the present invention. First, as shown in FIG. 5A, a first mask 32I with a rough pattern is placed below the metal plate 30, and a host material evaporation source 35I is placed below the first mask 32I. During the evaporation, the host material evaporation source 35I can pass through the openings 33 of the first mask 32I to deposit a plurality of host material film 36I arranged in array on predetermined regions of the metal plate 30; as shown in FIG. 5B. At the same time, as shown in FIG. 5C, another first mask 32II with a rough pattern is placed below a metal net 31, and a dopant material evaporation source 35II is placed below the first mask 32II. During evaporation, the dopant material evaporation source 35II can pass through the openings 33 of the first mask 32II to deposit a plurality of dopant material film 36II arranged in array on the metal net 31, as shown in FIG. 5D.

Figure 5E:
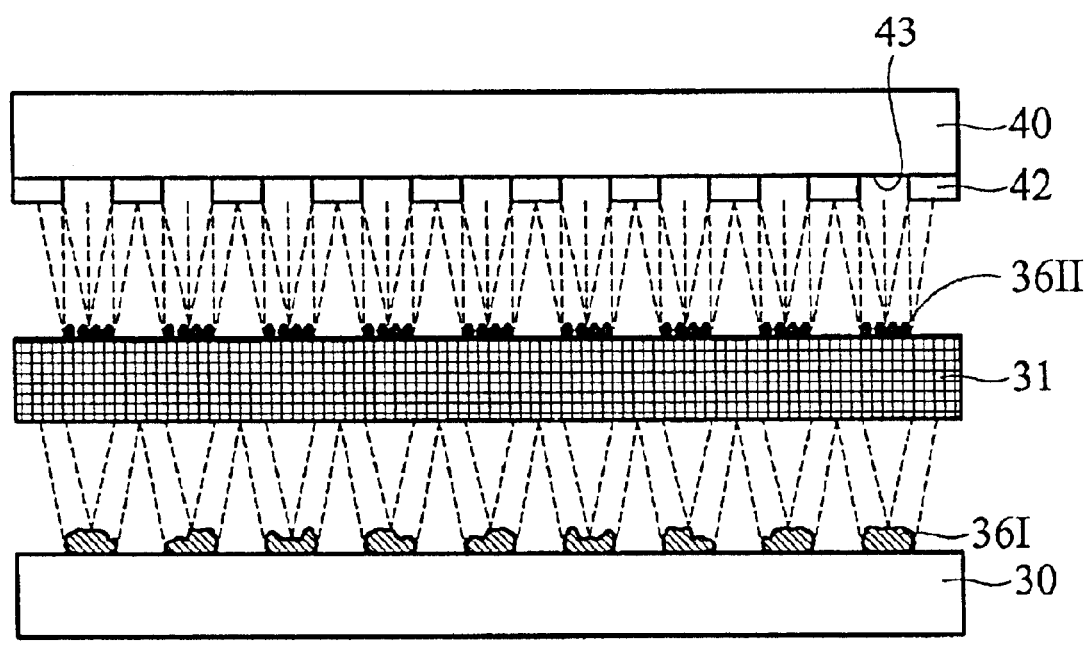

Then, as shown in FIG. 5E, the second mask 42 with a precise pattern is placed below the glass substrate 40, the metal net 31 with the dopant material film 36II is inverted and placed below the second mask 42, and the metal plate 30 with the host material film 36I is inverted and placed below the metal net 31. Next, using any well-known alignment technology, the dopant material film 36II and the host material film 36I are aligned to the openings 43 of the second mask 42, respectively. Finally, in evaporating, since the dopant materials can pass through the openings 43 and the host materials can pass through the metal net 31 and the openings 43, dopant materials and host materials are co-evaporated on predetermined regions of the glass substrate 40 to serve as luminescent thin film.

Fourth Embodiment

Figure 6A:
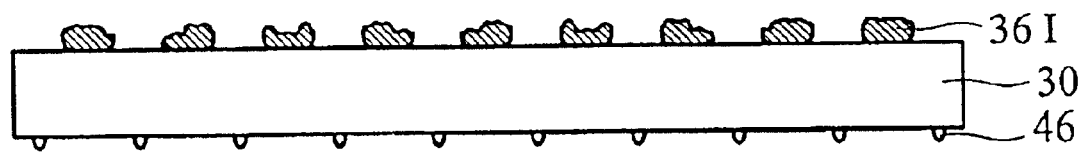
FIG. 6A is a schematic diagram showing a modified metal plate according to the fourth embodiment of the present invention.
Figure 6B:
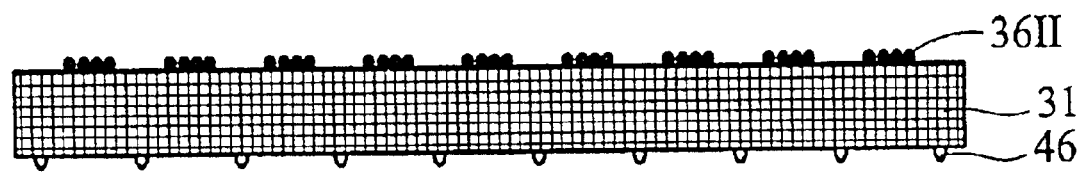
FIG. 6B is a schematic diagram showing a modified metal net according to the fourth embodiment of the present invention.

The fourth embodiment provides a modified structure to improve the above-described metal plate 30 and metal net 31. FIG. 6A is a schematic diagram showing a modified metal plate according to the fourth embodiment of the present invention. In the modified structure, a plurality of supporting ribs 46 is disposed on the backside of the metal plate 30 to provide mechanical support. Also, the supporting ribs 46 can increase the thermal conductivity of the metal plate 30 to improve the heating-temperature uniformity during evaporation. FIG. 6B is a schematic diagram showing a modified metal net according to the fourth embodiment of the present invention. In the modified structure, a plurality of supporting ribs 46 is disposed on the back side of the metal net 31 to provide mechanical support and increased thermal conductivity.

It is to be understood that the present invention is not limited to the embodiments described above, but encompasses any and all embodiments within the scope of the following claims.

What is claimed is:

1. A method of evaporating thin film used in organic electro-luminescent display, comprising steps of:
   providing a display substrate;
   providing a mask having a plurality of openings and placed below the display substrate;
   providing a plane evaporation source placed below the mask, wherein the plane evaporation source has a plurality of evaporating material cells arranged in array which are respectively aligned to the openings of the mask; and
   evaporating the evaporating material cells to deposit a plurality of thin films on predetermined regions of the display substrate;
   wherein the formation of the plane evaporation source comprises steps of:
      providing a metal plate;
      providing at least one kind of evaporation source placed below the metal plate; and
      evaporating the evaporation source to form the evaporating material cells on the metal plate.

2. The method according to claim 1, wherein the evaporating material cell is of organic electro-luminescent materials.

3. The method according to claim 1, wherein the formation of the plane evaporation source further comprises a step of providing a mask which has a plurality of openings and is disposed between the metal plate and the evaporation source.

4. The method according to claim 1, wherein a plurality of types of evaporation sources are provided below the metal plate.

5. The method according to claim 1, wherein the metal plate is rotated during evaporation.

6. The method according to claim 1, wherein the back side of the metal plate comprises a plurality of supporting ribs.

7. A method of evaporating thin film used in organic electro-luminescent display, comprising steps of:
   providing a display substrate;
   providing a mask having a plurality of openings and placed below the display substrate;
   providing a first plane evaporation source placed below the mask, wherein the first plane evaporation source has a metal net and a plurality of first evaporating material cells which are respectively aligned to the openings of the mask;
   providing a second plane evaporation source placed below the first plane evaporation source, wherein the second plane evaporation source has a metal plate and a plurality of second evaporating material cells which are respectively aligned to the openings of the mask; and
   evaporating the first evaporating material cells and the second evaporating material cells to deposit a plurality of thin films on predetermined regions of the display substrate.

8. The method according to claim 7, wherein the first evaporating material cell and the second evaporating material cell are of organic electro-luminescent materials.

9. The method according to claim 7, wherein the formation of the first plane evaporation source comprises steps of:
   providing the metal net;
   providing a first mask which has a plurality of first openings and is placed below the metal net;
   providing at least one kind of first evaporation source which is placed below the first mask; and
   evaporating the first evaporation source to form the first evaporating material cells on the metal net.

10. The method according to claim 9, wherein the metal net is rotated during evaporation.

11. The method according to claim 9, wherein the back side of the metal net comprises a plurality of supporting ribs.

12. The method according to claim 7, wherein the formation of the second plane evaporation source comprises steps of:
   providing the metal plate;
   providing a second mask which has a plurality of first openings and is placed below the metal plate;
   providing at least one kind of second evaporation source which is placed below the second mask; and
   evaporating the second evaporation source to form the second evaporating material cells on the metal plate.

13. The method according to claim 12, wherein the metal plate is rotated during evaporation.

14. The method according to claim 12, wherein the back side of the metal plate comprises a plurality of supporting ribs.

* * * * *